(12) United States Patent
Kobayashi

(10) Patent No.: US 6,469,581 B1
(45) Date of Patent: Oct. 22, 2002

(54) HEMT-HBT DOHERTY MICROWAVE AMPLIFIER

(75) Inventor: Kevin W. Kobayashi, Torrance, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/878,106

(22) Filed: Jun. 8, 2001

(51) Int. Cl.[7] .............................. H03F 3/68; H03F 3/60
(52) U.S. Cl. ...................... 330/295; 330/53; 330/124 R; 330/286
(58) Field of Search ............................... 330/53, 124 R, 330/286, 295

(56) References Cited

U.S. PATENT DOCUMENTS

| | | | |
|---|---|---|---|
| 4,121,055 A | 10/1978 | Doherty | 179/15 A |
| 4,739,307 A | 4/1988 | Marcovici et al. | 330/282 |
| 5,012,200 A | 4/1991 | Meinzer | 330/124 R |
| 5,017,888 A | 5/1991 | Meinzer | 330/124 R |
| 5,162,243 A | 11/1992 | Streit et al. | 257/198 |
| 5,262,335 A | 11/1993 | Streit et al. | 437/31 |
| 5,352,911 A | 10/1994 | Grossman | 257/198 |
| 5,420,541 A | 5/1995 | Upton et al. | 330/286 |
| 5,448,087 A | 9/1995 | Streit et al. | 257/198 |
| 5,534,820 A | 7/1996 | Tupper et al. | 330/149 |
| 5,568,086 A | 10/1996 | Schuss et al. | 330/124 R |
| 5,631,477 A | 5/1997 | Streit et al. | 257/197 |
| 5,648,666 A | 7/1997 | Tran et al. | 257/197 |
| 5,672,522 A | 9/1997 | Streit et al. | 437/31 |
| 5,734,596 A | 3/1998 | Medelius et al. | 330/124 R |
| 5,736,417 A | 4/1998 | Oki et al. | 437/31 |
| 5,739,723 A | 4/1998 | Sigmon et al. | 330/295 |
| 5,757,229 A * | 5/1998 | Mitzlaff | 330/124 R |
| 5,786,727 A | 7/1998 | Sigmon | 330/124 R |
| 5,804,487 A | 9/1998 | Lammert | 438/319 |
| 5,874,921 A | 2/1999 | Doherty et al. | 343/702 |
| 5,880,633 A | 3/1999 | Leizerovich et al. | 330/124 R |
| 5,886,575 A | 3/1999 | Long | 330/127 |
| 5,994,194 A | 11/1999 | Lammert | 438/319 |
| 6,008,694 A | 12/1999 | El-Sharawy | 330/124 R |
| 6,097,252 A | 8/2000 | Sigmon et al. | 330/124 R |
| 6,133,788 A | 10/2000 | Dent | 330/124 R |
| 6,320,462 B1 * | 11/2001 | Alley | 330/124 R |

OTHER PUBLICATIONS

McMorrow, et al., "The Microwave Doherty Amplifier," IEEE MTT–S Digest, 1994, pp. 1653–1656.

Campbell, "A Fully Integrated Ku–Band Doherty Amplifer MMIC," IEEE Microwave and Guided Wave Letters pp. 114–116, vol. 9, No. 3, Mar. 1999.

Yang, et al. "High Linearity K–Band Inp HBT Power Amplifier MMIC with 62.8%PAE at 21 GHz," pp. 73–79, GaAs IC Symp. Dig., Monterey, CA 1999.

Asbeck, et al. "Improved Transceiver Architectures and Circuits for CMOS Radio Frequency Applications," Final Report 1998–99 for MICRO Project 98–073, Hughes Electronics and Rockwell International.

* cited by examiner

*Primary Examiner*—Patricia Nguyen
(74) *Attorney, Agent, or Firm*—Kattan Muchin Zavis Rosenman

(57) ABSTRACT

A microwave amplifier and more particularly to a microwave amplifier configured as a Doherty amplifier. The amplifier includes a carrier amplifier, a peak amplifier, a Lange coupler at the input of the amplifiers and quarter wave amplifier at the output of the amplifiers. In order to further increase the efficiency, the Doherty amplifier is formed from HEMT/HBT technology to take advantage of the low-noise performance of HEMTs and the high-linearity of HBTs to form a relatively efficient amplifier that functions as a low-noise amplifier at low power levels and automatically switches to high-power amplification for relatively high-impact RF power levels.

10 Claims, 4 Drawing Sheets

HEMT-HBT DOHERTY MICROWAVE AMPLIFIER

CROSS-REFERENCE TO RELATED APPLICATIONS

This application is related to commonly-owned co-pending patent applications: "Application of the Doherty as a Pre-Distortion Circuit for Linearizing Microwave Amplifiers," by Kevin W. Kobayashi, Ser. No. 09/878,104, and "Asymmetrically Biased High Linearity Balanced Amplifier," by Kevin W. Kobayashi, Ser. No. 09/878,113.

BACKGROUND OF THE INVENTION

1. Field of the Invention

The present invention relates to a power amplifier and more particularly to a microwave power amplifier topology that functions as a low-noise amplifier when the input signal level is low and automatically switches to high-power amplification for relatively high input signal levels.

2. Description of the Prior Art

Radio frequency and microwave communication systems are known to place ever-increasing demands on the linearity and efficiency of power amplifiers. Unfortunately, conventional power amplifiers operate at maximum efficiency at or near saturation. Thus, in order to accommodate communication signals having varying amplitudes, systems utilizing conventional power amplifiers normally operate at less than peak efficiency for a substantial portion of the time.

In order to solve this problem, so-called Doherty amplifiers have been developed. Doherty amplifiers were first introduced by an inventor having the same name and described in; "Radio Engineering Handbook" 5$^{th}$ edition, McGraw Hill Book Company, 1959, pp. 18–39, as well as U.S. Pat. No. 2,210,028, hereby incorporated by reference. The standard topology for a Doherty amplifier includes a carrier amplifier, operated in a Class AB mode, and peak amplifier, operated in a Class C mode. A quadrature Lange coupler is used at the input so that the carrier amplifier and peak amplifier signals will combine in phase. A quarter wave amplifier is provided at the outputs of the amplifier. In such amplifiers, as the input RF drive signal to the carrier amplifier increases, the carrier amplifier is driven to the point of saturation for maximum linear efficiency. The peak amplifier is used to maintain the linearity of the output signal when the carrier amplifier begins to saturate.

Such Doherty amplifiers have been known to be used in various microwave and RF applications. Examples of such applications are disclosed in U.S. Pat. Nos. 5,420,541; 5,880,633; 5,886,575, 6,097,252 and 6,133,788. Examples of such Doherty amplifiers are also disclosed in "A Fully Integrated Ku-Band Doherty Amplifier MMIC," by C. F. Campbell, *IEEE Microwave and Guided Wave Letters*, Vol. 9, No. 3, March 1999, pp. 114–116; "An 18–21 GHz InP DHBT Linear Microwave Doherty Amplifier", by Kobayashi, et al, 2000 *IEEE Radio Frequency Integrated Circuits Symposium Digest of Papers*, pages 179–182, "A CW 4 Ka-Band Power Amplifier Utilizing MMIC Multichip Technology," Matsunaga, et al., 1999, *GaAs IC Symposium Digest*, Monterey, Calif., pp. 153–156, all hereby incorporated by reference.

The systems mentioned above are known to provide relatively good phase linearity and high efficiency since the power amplifier only needs to respond to constant or near constant RF amplitude envelopes. Unfortunately, the RF amplitude envelopes of multi-carrier signals (multi-frequency signals), used for example in satellite communications systems, change with time as a function of the bandwidth thus exhibiting noise-like characteristics. Power amplifiers utilized in multi-carrier systems must be able to operate over a relatively large instantaneous bandwidth while providing relatively good phase linearity for RF signals having non-constant envelopes.

In addition, such power amplifiers, used as low-noise amplifiers (LNA), for example, as a first amplification stage in an RF or microwave receiver, must be able to provide linear amplification at a relatively high efficiency. Unfortunately, in applications when the RF drive signal has a non-constant RF envelope, for example, as in a multi-carrier satellite communication system, the Doherty amplifier is operated such that the carrier amplifier is operated at about one half of its maximum power capability during low power operation to provide relatively low noise performance. Such operation results in relatively low linearity and low efficiency.

In order to increase the linearity and efficiency of Doherty amplifiers used in applications of non-constant RF envelopes, various techniques have been used. For example, U.S. Pat. No. 5,739,723 discloses an active bias circuit which biases the peaking amplifier to improve the efficiency. Unfortunately, the active bias circuit includes a number of resistors which increases the overall power consumption of the circuit thus providing a less than optimum efficiency.

In order to minimize the bias power consumption of such a Doherty amplifier, U.S. Pat. No. 5,568,086 discloses a combining network for combining the output signals of the carrier amplifier and the peak amplifier to provide improved impedance matching. The combining network includes a pair of quarter waves transformers and a number of quarter wave phase shifting elements. Unfortunately, efficiencies of only 40%–50% were realized in the combining network disclosed in the '086 patent. Power efficiency in many applications such as satellite communication systems is a critical factor. Thus there is an ever-increasing need to further improve the efficiency of power amplifiers used in such applications.

SUMMARY OF THE INVENTION

The present invention relates to a microwave amplifier and more particularly to a microwave amplifier configured as a Doherty amplifier. The amplifier includes a carrier amplifier, a peak amplifier, a Lange coupler at the input of the amplifiers and quarter wave amplifier at the output of the amplifiers. In order to further increase the efficiency, the Doherty amplifier is formed from HEMT/HBT technology to take advantage of the low-noise performance of HEMTs and the high-linearity of HBTs to form a relatively efficient amplifier that functions as a low-noise amplifier at low power levels and automatically switches to high-power amplification for relatively high-impact RF power levels.

DESCRIPTION OF THE DRAWINGS

These and other advantages of the present invention will be readily understood with reference to the following specification and attached drawing wherein.

DETAILED DESCRIPTION OF THE INVENTION

Figure 1:
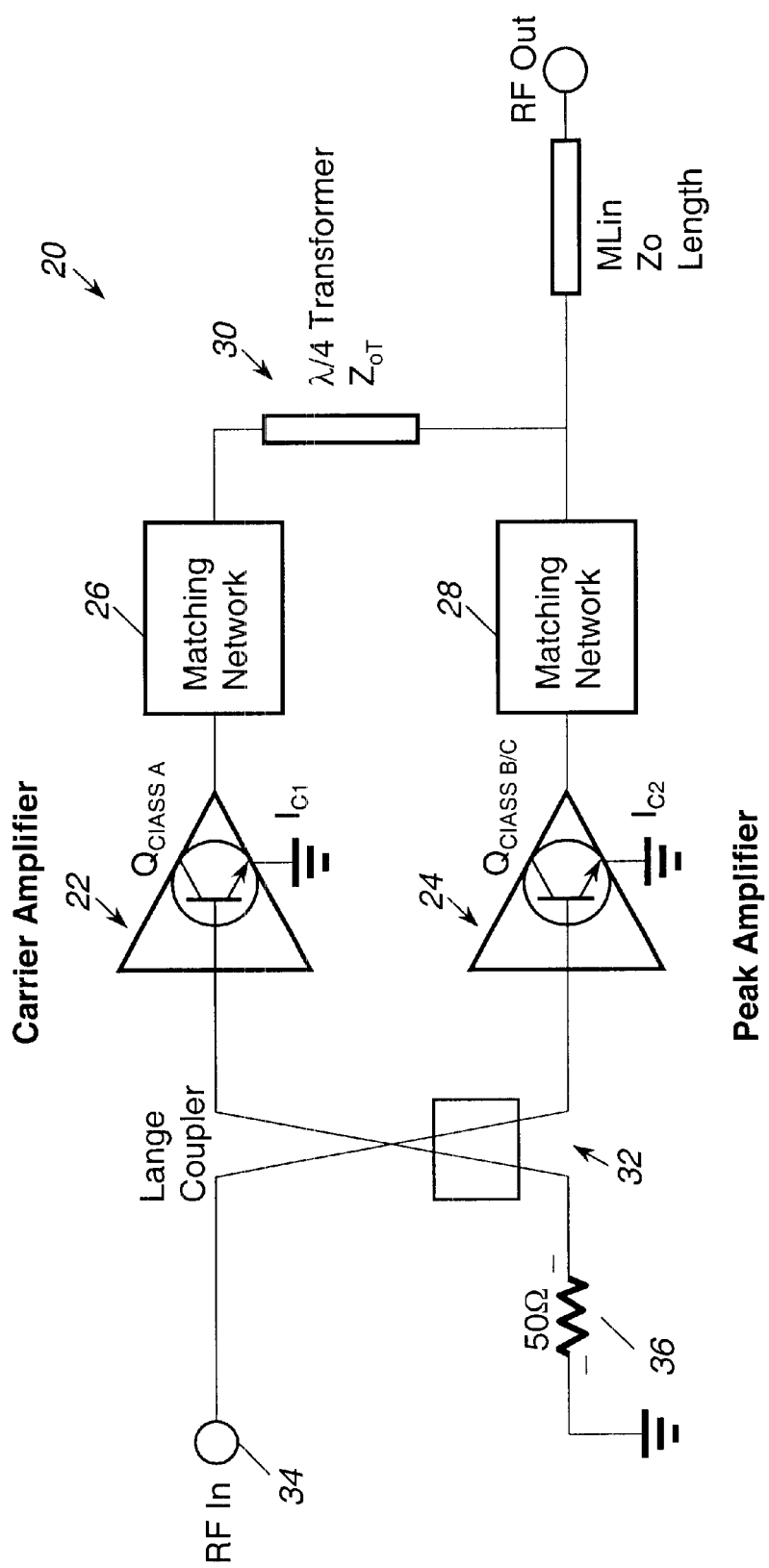
FIG. 1 is a schematic diagram of the microwave power amplifier in accordance with the present invention.

The present invention relates to a microwave power amplifier configured as a Doherty amplifier, generally identified with the reference numeral 20. The microwave power amplifier 20 includes a carrier amplifier 22 and a peak amplifier 24. In known Doherty amplifiers, both the carrier amplifier and the peak amplifier are formed from heterojunction bipolar transistors (HBT) and, for example, as a prematched 1.5×30 $\mu m^2$×four finger DHBT device with a total emitter area of 180 $\mu m^2$. An example of such a device is disclosed in "An 18–21 GHz InP DHBT Linear Microwave Doherty Amplifier", by Kobayashi, et al, 2000 *IEEE Radio Frequency Integrated Circuits Symposium Digest of Papers*, pages 179–182, hereby incorporated by reference. In order to improve the efficiency and linearity of the Doherty amplifier 20, the Doherty amplifier 20 is formed from HEMT/HBT technology to take advantage of the low-noise performance and low intermodulation distortion of HEMTS and the high-linearity of HBTs.

An example of a HEMT integrated on the same substrate as an HBT is disclosed in European Publication No. EP0710984A1, published on May 8, 1996, corresponding to European Patent Application No. 95115137.2, commonly owned U.S. Pat. Nos. 5,838,031 and 5,920,230, as well as: "Monolithic HEMT-HBT Integration by Selective MBE," by D. C. Streit, D. K. Umemoto, K. W. Kobayashi and A. K. Oki, IEEE Transactions on Electron Devices, Vol. 42, No. 4, April 1995, pp. 618–623; "A Monolithic HBT-Regulated HEMT LNA by Selective MBE," by D. C. Streit, K. W. Kobayashi, A. K. Oki and D. K. Umemoto, Microwave and Guided Wave Letts., Vol. 5, No. 4, April 1995, pp. 124–126.

In one embodiment, the carrier amplifier 22 is formed from an HEMT while the peak amplifier 24 is formed from an HBT. In this case, a low noise HEMT device acts as the carrier amplifier 22 operating in class A under small input signal conditions, providing low noise and high linearity. As the input signal strength increases and the class A amplifier begins to compress and clip the input signal, the HBT peak amplifier 24 turns on to extend the linear amplification. Since the HBT has an abrupt base-emitter turn-on resembling a diode characteristic, it optimally acts as a peak amplifier whose turn-on threshold can be set at the base of the HBT transistor. The more abrupt the turn-on, the more efficient amplification of the increasing input power.

In an alternative embodiment of the invention, the carrier amplifier 22 is formed as an HBT and the peak amplifier 24 from an HEMT. This embodiment is for applications in which high linearity and efficiency are required under low input power conditions where operating a more efficient class A HBT amplifier as the carrier amplifier is more attractive. Using a higher speed low noise HEMT device as a peak amplifier helps prevent increased noise transmission and additional distortion, which would be present if an HBT amplifier is used as a peak amplifier due to the abrupt diode/mixer like characteristics of the HBT which is noisier than a HEMT. The HEMT would turn-on slower with increased input power where it would operate closer to its low noise bias operating regime. In addition, the wider band HEMT device could also preserve the data signal integrity as it turns on from class B/C. The result is less AM-AM and AM-PM distortion for the peak amplifier when it begins to turn on.

In order for the output signals from the carrier amplifier 22 and the peak amplifier 24 to be in phase at the output, a Lange coupler 32 is provided. One input terminal of the Lange coupler 32 is used as an RF input port 34. The other input terminal is terminated to an input resistor 36. One output terminal of the Lange coupler 32 is coupled to the input of the carrier amplifier 22 while the other output terminal is coupled to the input to the peak amplifier 24. A 8/4 impedance transformer having a characteristic impedance $Z_o=2R_L+R_{opt}$ is provided at the output of the amplifiers 22 and 24. An output terminal of the power amplifier 20 is terminated to load impedance $R_L$. Both the carrier amplifier 22 and the peak amplifier 24 are configured to deliver maximum power when the load impedance $R_L$ is $R_{opt}$.

The carrier amplifier 22 is operated as a Class A amplifier while the peak amplifier 24 is operated as a Class B/C amplifier. In order to improve the isolation between the carrier amplifier 22 and the peak amplifier 24, for example, when the carrier amplifier 22 is biased as a Class A amplifier and the peak amplifier 24 is biased between Class B and C, matching networks 26 and 28 are coupled to the output of the carrier amplifier 22 and the peak amplifier 24. As such, the impedance of each amplifier stage will not contribute to the inter-modulation (IM) performance of the other stage.

In order to fully understand the invention, a discussion of known Doherty type amplifiers is presented first. More particularly, as set forth in: "A Fully Integrated Ku-Band Doherty Amplifier MMIC," supra, the loading impedance presented to the carrier and peak amplifiers of known Doherty amplifiers is a function of the output power delivered by the peak amplifier. During low input drive levels (i.e. levels in which the RF input amplitude is low), the peak amplifier is turned off resulting in a configuration in which the carrier amplifier saturates at a relatively low input drive level. As such, the carrier amplifier 22 will result in a higher power added efficiency (PAE) at lower input power levels. As the input power level increases, the peak amplifier will begin to turn on as the power delivered by the peak amplifier increases. The load presented to the carrier amplifier decreases allowing the carrier amplifier 24 to increase to provide power to the load.

Figure 3A:
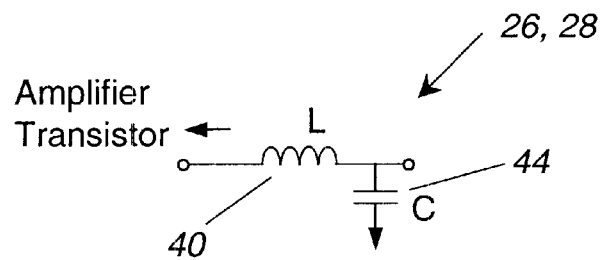
FIGS. 3A–3C illustrate matching networks for use with the present invention.
Figure 3B:
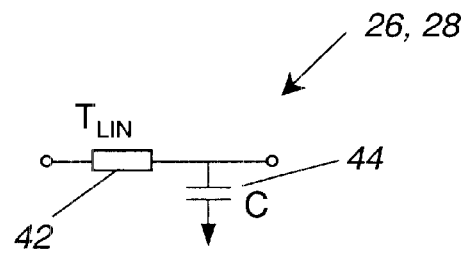
Figure 3C:
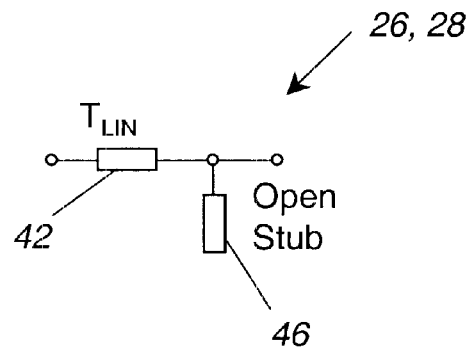

The matching networks 26 and 28 are serially coupled to the outputs of the carrier and peak amplifiers 22 and 24, respectively. These matching networks 26 and 28 may be provided as low pass networks, for example, as illustrated in FIGS. 3A–3C. As shown in FIGS. 3A–3C, the matching networks 26, 28 may be implemented as a series inductance 40 or transmission line 42 and a shunt capacitance 44 or open stub 46. In operation, when the carrier amplifier 22 is on and the peak amplifier 24 is off, the matching networks 26, 28 provide a relatively high impedance (mainly due to the high impedance transmission line 42 or inductance 40) such that the peak amplifier 24 does not load down the carrier amplifier 22, operating in class A, to achieve optimum linearity and efficiency under low input power conditions.

The theory of operation of the matching networks 26, 28 is contrary to the operation of matching networks used for conventional power amplifiers. More particularly, typically in a power amplifier application a low impedance series transmission line or low impedance shunt capacitance or open stub is provided at the output of the power transistor in order to efficiently transform the low impedance of the power transistor to a higher manageable impedance as well as provide isolation between the amplifying transistors.

In accordance with another aspect of the invention, the carrier amplifier 22 and peak amplifier 24 may be DC biased tuned so that the optimum IM performance can be achieved for the specific operating frequency of the amplifier. For example, for a 21 GHz carrier frequency, a microwave amplifier 20 can be DC biased tuned to minimize the IM performance at 20 GHz.

Figure 4A:
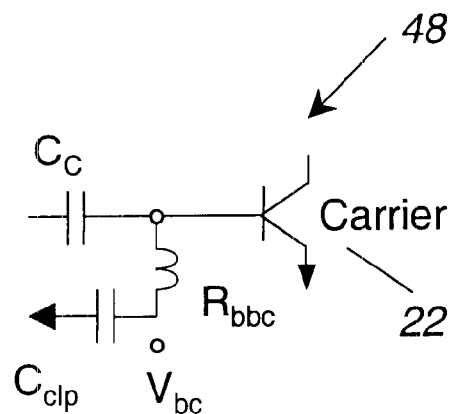
FIGS. 4A–4B illustrate biasing networks for use with an HBT and a HEMT, respectively, for use with the present invention.
Figure 4B:
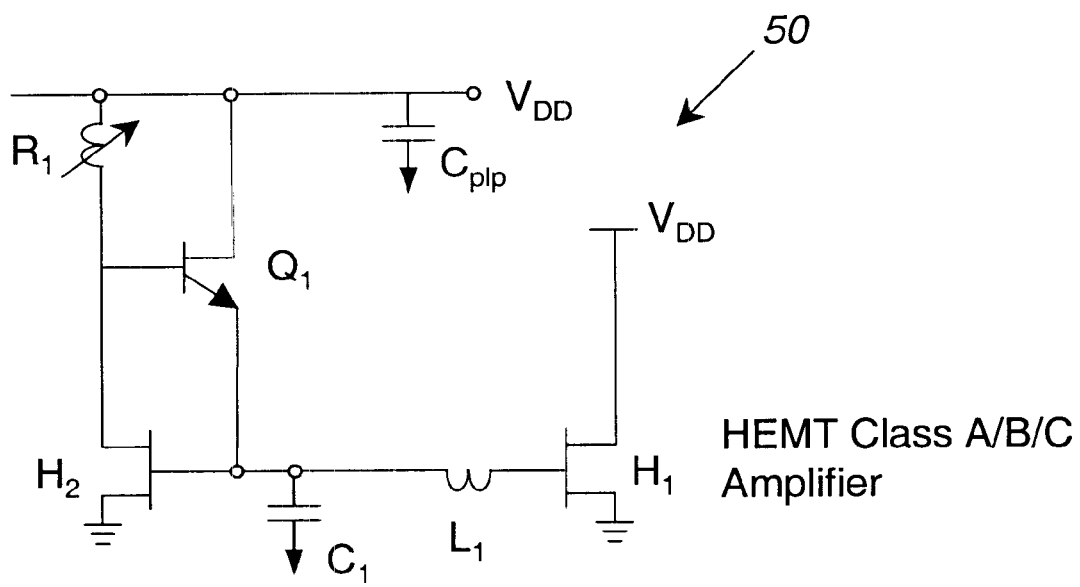

Various biasing networks can be used for tuning the carrier and peak amplifiers 22 and 24. Exemplary biasing networks 48 and 50, are illustrated in FIGS. 4A and 4B. In particular, FIG. 4A is a schematic diagram of an exemplary biasing circuit 48 for an HBT while FIG. 4B is a schematic diagram of a biasing circuit 50 for a HEMT.

Referring first to FIG. 4A, the HBT biasing network 48 includes a biasing resistor $R_{bbc}$, coupled to an external source of DC, $V_{bc}$. A low pass capacitor $C_{clp}$ is coupled to the biasing resistor $R_{bbc}$, the external source DC voltage $V_{bc}$, and ground to filter out noise. A coupling capacitor $C_{cc}$, may be used to couple the carrier and peak amplifiers 22 and 24 to the Lange coupler 32.

FIG. 4B is a schematic diagram of an exemplary biasing network 50 for a HEMT. The HEMT $H_1$ may be either the carrier amplifier 22 or the peak amplifier 24. The gate of the HEMT $H_1$ is coupled to the gate of another HEMT (or FET) $H_2$ by way of an RF choke $L_1$. A bypass capacitor $C_1$, coupled between the gate of the HEMT $H_2$ and ground, isolates the bias network from the RF network. The HEMT $H_2$ functions as a current mirror and is selected to have an area 10–20 smaller than the HEMT $H_1$.

Both HEMTS $H_1$ and $H_2$ are connected in a common source configuration. The drain of the HEMT $H_1$ is connected to a DC voltage supply $V_{DD}$. The drain of the HEMT $H_2$ is also coupled to the DC voltage supply VDD by way of a variable resistance $R_1$, which may alternatively be implemented as a FET (or HEMT not shown) configured as a voltage variable resistance. Either the variable resistance $R_1$ or voltage variable resistance FET may be used to adjust the bias and linearity of either the carrier amplifier 22 or peak amplifier 24, as discussed above. In a configuration which utilizes a voltage variable resistance FET, the drain and source terminals are connected to the drain terminal of the HEMT $H_2$ and the DC voltage source $V_{DD}$, in place of the variable resistance $R_1$, shown in FIG. 4B. A variable voltage supply of DC (not shown) may be connected to the gate of the voltage variable resistance FET to vary its resistance and, in turn, the biasing level of the HEMT $H_1$.

A bipolar transistor or HBT may be used in the biasing network 50 to provide a low impedance voltage source to the HEMT $H_1$. The transistor $Q_1$ also provides for ramp up of the current in the HEMT $H_1$ under class B/C operation. The transistor $Q_1$ is configured such that its collector and emitter terminals are coupled to the DC voltage source $V_{DD}$ and the gate of the HEMT $H_2$. The base of the bipolar transistor is connected to the node between the variable resistance $R_1$ and the drain of the HEMT $H_2$.

A bypass capacitor $C_{bypass}$ may be used to isolate the DC voltage supply. The bypass capacitor $C_{bypass}$ is coupled between the DC voltage supply $V_{DD}$ and ground.

The biasing circuits, for example, the biasing circuits 48 and 50, enable one or the other or both the carrier amplifier 22 and peak amplifier to be electronically tuned. In the case of the exemplary biasing circuits 48 and 50, illustrated in FIGS. 4A and 4B, respectively, the biasing and thus the linearity of the carrier and peak amplifiers 22 and 24 may be varied by varying the amplitude of the external DC voltage coupled to the biasing networks 48 and 50.

The tuning of the carrier and peak amplifiers 22 and 24, as provided by the biasing circuits 48 and 50, provides many important advantages in accordance with the present invention. First, the tuning allows the carrier and peak amplifiers 22 and 24 to be tuned for optimal linearity. Secondly, tuning allows for improved intermodulation distortion over a relatively wide input power range. As such, the amplifier 20 can be tuned such that the operating range (i.e. carrier amplifier frequency) has the maximum IM rejection possible. Moreover, as discussed above, the relatively high impedance of the matching networks 26 and 28 results in the virtual isolation of the IM products of the carrier amplifier 22 and peak amplifier 24, therefore, providing less IM products. Lastly, the tuning can also be used to provide gain expansion and phase compression for use in predistortion linearization applications.

Figure 2:
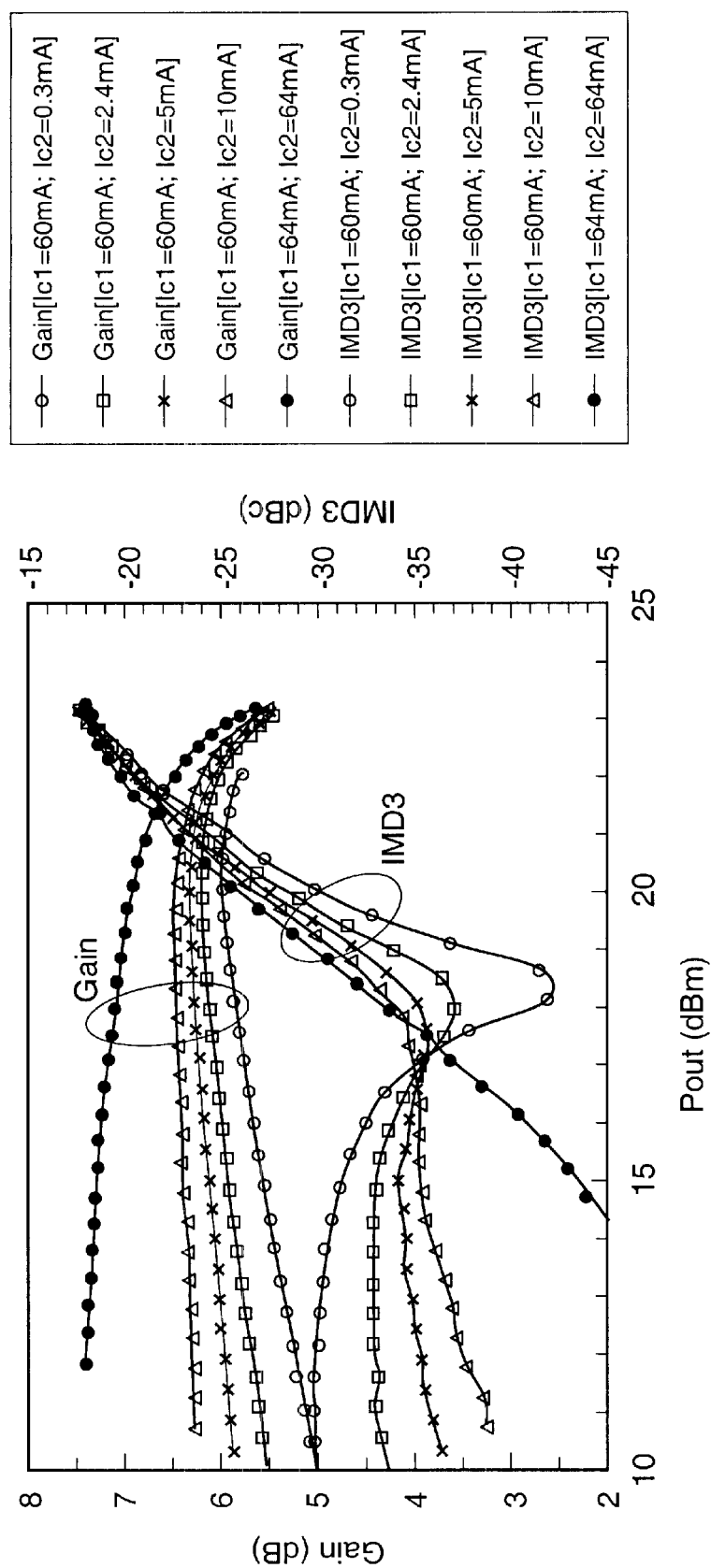
FIG. 2 is a graphical representation of the output power as a function of the gain for various biasing points of the carrier and peak amplifiers of an HBT Doherty amplifier.

FIG. 2 illustrates the measured gain and IM3 (third order modulation products) as a function of output power at 21 GHz for various biasing conditions of the amplifier 20 in which both the carrier amplifier 22 and peak amplifier 24 are formed from HBTs for illustration purposes. An amplifier 20 formed from composite HEMT/HBT as in the present invention will be somewhat different. FIG. 2 is presented to illustrate the electronic tuning capability of the device. In particular, the IM3 and gain is illustrated for Class A bias operation (Ic1=64 mA; Ic2=64 mA) as well as asymmetric bias conditions. In particular, the asymmetrically biased conditions are illustrated when the peak amplifier 24 is off and the carrier amplifier 22 is biased in a Class A mode (IC1=60–64 mA) and the peak amplifier is bias in Class B (IC2=0.3–10 mA). As illustrated in FIG. 2, adjustment of the peak amplifier biased current (IC2) allows the shape and performance of the IM3 linearity ratio to be significantly improved across a relatively wide output power range. During a biasing condition (i.e. Ic1=60 mA; Ic2=0.3 mA), when the peak amplifier is nearly shut off, the microwave power amplifier 20 in accordance with the present invention achieves a relatively dramatic improvement of the IM3 ratio resulting in a deep IM3 cancellation of about −43 dBc. For multi-carrier communication systems, an IM3 ratio of about 30 dBc is a typical requirement for linearity. With such linearity, the microwave power amplifier 20 is able to achieve about 20% power added efficiency (PAE) and an output power of about 20.1 dBm which is a significant improvement compared to conventional linear Class A bias mode which achieves about 13% PAE and 18.8 dBm output power for the same linearity.

Obviously, many modification and variations of the present invention are possible in light of the above teachings. For example, thus, it is to be understood that, within the scope of the appended claims, the invention may be practiced otherwise than as specifically described above.

What is claimed and desired to be secured by Letters Patent of the United States is:

1. A microwave power amplifier comprising:
   a carrier amplifier formed from one of either an HEMT or an HBT having a first input an first output;
   a peak amplifier formed the other of an HEMT or an HBT having a second input and a second output; and
   a coupler having first and second input terminals and first and second output terminals, said first and second output terminals coupled to said first and second inputs, said first input terminal defining a RF input port and said second input terminal coupled to an input termination impedance.

2. The microwave power amplifier as recited in claim 1, wherein said carrier amplifier is formed from at least one HEMT.

3. The microwave power amplifier as recited in claim 2, wherein said peak amplifier is formed from at least one HBT.

4. The microwave power amplifier as recited in claim 1, wherein said carrier amplifier is formed from at least one HBT.

5. The microwave power amplifier as recited in claim 4, wherein said peak amplifier is formed from at least one HEMT.

6. A microwave power amplifier comprising:

a carrier amplifier formed from one of either an HEMT or an HBT having a first input an first output;

a peak amplifier formed the other of an HEMT or an HBT having a second input and a second output;

a coupler having first and second input terminals and first and second output terminals, said first and second output terminals coupled to said first and second inputs, said first input terminal defining a RF input port and said second input terminal coupled to an input termination impedance; and means for electronically tuning one or the other of said carrier amplifier and said HBT amplifier.

7. The microwave power amplifier as recited in claim 6, wherein said carrier amplifier is formed from at least one HEMT.

8. The microwave power amplifier as recited in claim 7, wherein said peak amplifier is formed from at least one HBT.

9. The microwave power amplifier as recited in claim 6, wherein said carrier amplifier is formed from at least one HBT.

10. The microwave power amplifier as recited in claim 9, wherein said peak amplifier is formed from at least one HEMT.

* * * * *